United States Patent
Rodriguez Martinez et al.

(10) Patent No.: US 12,405,399 B2
(45) Date of Patent: Sep. 2, 2025

(54) HYDROCARBON FLOW SIMULATION

(71) Applicant: TotalEnergies OneTech, Courbevoie (FR)

(72) Inventors: Alejandro Rodriguez Martinez, Courbevoie (FR); Stefano Frambati, Courbevoie (FR)

(73) Assignee: TotalEnergies OneTech, Courbevoie (FR)

( * ) Notice: Subject to any disclaimer, the term of this patent is extended or adjusted under 35 U.S.C. 154(b) by 969 days.

(21) Appl. No.: 17/433,453

(22) PCT Filed: Mar. 5, 2019

(86) PCT No.: PCT/IB2019/000300
§ 371 (c)(1),
(2) Date: Aug. 24, 2021

(87) PCT Pub. No.: WO2020/178609
PCT Pub. Date: Sep. 10, 2020

(65) Prior Publication Data
US 2022/0171091 A1    Jun. 2, 2022

(51) Int. Cl.
*G01V 20/00*    (2024.01)
(52) U.S. Cl.
CPC .................. *G01V 20/00* (2024.01)
(58) Field of Classification Search
CPC .................................................. G01V 20/00
(Continued)

(56) References Cited

U.S. PATENT DOCUMENTS 10,521,956 B2 * 12/2019 Drinovsky ............... G06T 17/05
2005/0234690 A1 * 10/2005 Mainguy ................. G01V 1/282
                                                                    703/10

(Continued)

FOREIGN PATENT DOCUMENTS

| WO | WO 2011/059535 A1 | 5/2011 |
| WO | WO 2015/187208 A1 | 12/2015 |
| WO | WO 2018/134635 A1 | 7/2018 |

OTHER PUBLICATIONS

Harris et. al. ("Complex Geological Modeling and Quality Assurance Using Unstructured Grids", Society of Petroleum Engineers, 2018, pp. 1-20) (Year: 2018).*

(Continued)

*Primary Examiner* — Iftekhar A Khan
(74) *Attorney, Agent, or Firm* — Knobbe, Martens, Olson & Bear, LLP

(57) ABSTRACT

The invention notably relates to computer-implemented designing of a geological simulation grid configured for hydrocarbon flow simulation in a geological environment. The designing of the geological simulation grid comprises providing (S10) a geometrical grid having cells and representing the geological environment; providing (S20) a structural model that represents geological surfaces of the geological environment, the geological surfaces comprising one or more geological surfaces each in contact with at least one other geological surface; and determining (S30), for each geological surface of the structural model, pairs of cells that represent the geological surface, the pairs of cells determined for at least one respective geological surface in contact with at least one respective other geological surface each including a first cell and a second cell located both on a same side of the at least one respective other geological surface. This improves the field of geological simulation.

17 Claims, 3 Drawing Sheets

(58) Field of Classification Search
USPC .......................................................... 703/10
See application file for complete search history.

(56) References Cited

U.S. PATENT DOCUMENTS

| | | | | |
|---|---|---|---|---|
| 2007/0219724 | A1* | 9/2007 | Li ........................... | G01V 1/306 702/12 |
| 2011/0071799 | A1* | 3/2011 | Slotte ..................... | G06T 17/05 703/1 |
| 2011/0246157 | A1* | 10/2011 | Pauget .................... | G01V 1/30 703/6 |
| 2012/0022837 | A1* | 1/2012 | Asbury ................. | G06T 17/205 703/2 |
| 2012/0215513 | A1* | 8/2012 | Branets ................. | G01V 99/00 703/10 |
| 2012/0265510 | A1* | 10/2012 | Lepage .................. | G01V 20/00 703/9 |
| 2013/0204598 | A1* | 8/2013 | Mallet ................... | G01V 20/00 703/6 |
| 2013/0218538 | A1* | 8/2013 | Fuecker .................. | G06F 30/23 703/2 |
| 2013/0231903 | A1* | 9/2013 | Li ........................... | G01V 1/325 703/2 |
| 2013/0246031 | A1* | 9/2013 | Wu .......................... | G06T 17/05 703/10 |
| 2014/0136158 | A1* | 5/2014 | Hegazy ................... | G06T 17/20 703/2 |
| 2015/0212231 | A1* | 7/2015 | Borouchaki ........... | G01V 11/00 703/10 |
| 2015/0355373 | A1* | 12/2015 | Zhuo ...................... | G01V 20/00 703/2 |
| 2016/0103246 | A1* | 4/2016 | Freeman ................ | G01V 20/00 703/10 |
| 2016/0124117 | A1* | 5/2016 | Huang .................... | G06T 17/05 703/2 |
| 2016/0180582 | A1* | 6/2016 | Forge ..................... | G06T 17/20 345/423 |
| 2017/0184760 | A1* | 6/2017 | Li ........................... | G06F 30/20 |
| 2018/0031719 | A1* | 2/2018 | Huang .................... | G06T 17/20 |
| 2018/0223633 | A1* | 8/2018 | Dinariev ................. | E21B 41/00 |
| 2018/0252101 | A1* | 9/2018 | Bartetzko ................ | E21B 7/04 |
| 2018/0347320 | A1* | 12/2018 | Renaudeau ............. | G06F 30/20 |
| 2018/0348401 | A1* | 12/2018 | Imhof ..................... | G06T 17/05 |
| 2019/0265373 | A1* | 8/2019 | Ito .......................... | G01V 20/00 |
| 2019/0302309 | A1* | 10/2019 | Li ........................... | G06F 17/142 |
| 2019/0361147 | A1* | 11/2019 | Frambati ................ | G01V 20/00 |
| 2019/0378343 | A1* | 12/2019 | Despinois .............. | G06T 19/20 |
| 2020/0226311 | A1* | 7/2020 | Ding ...................... | G01V 20/00 |
| 2021/0011193 | A1* | 1/2021 | Srivastava .............. | G06F 30/23 |
| 2021/0123334 | A1* | 4/2021 | Madasu .................. | G06F 30/27 |
| 2021/0149067 | A1* | 5/2021 | Miao ...................... | G06T 17/20 |
| 2022/0171091 | A1* | 6/2022 | Rodriguez Martinez ..................... G01V 20/00 |

OTHER PUBLICATIONS

Caumon et al. ("Visualization of grids conforming to geological structures: a topological approach", Computers & Geosciences 31 (2005) 671-680) (Year: 2005).*
He et al. ("Structured flow-based gridding and upscaling for modeling subsurface flow", Advances in Water Resources 29 (2006) 1876-1892) (Year: 2006).*
International Search Report and Written Opinion in PCT/IB2019/000300 dated Jan. 8, 2020 in ten pages.
Sieranoja, Sami. "High dimensional kNN-graph construction using space filling curves." Master's Thesis at University of Eastern Finland, Apr. 2015. 64 pages.

* cited by examiner

HYDROCARBON FLOW SIMULATION

FIELD OF THE INVENTION

The invention relates to the field of geological simulation, and more particularly to a computer-implemented method which comprises designing a geological simulation grid configured for hydrocarbon flow simulation in a geological environment, and to a computer program and a computer system therefore.

BACKGROUND

Geological simulation refers to all techniques for performing computer simulations related to a geological environment. These techniques assist actors by providing them with computerized representations of real, estimated or predicted states and/or processes related to the geological environment. For example, in the context of hydrocarbon production, hydrocarbon flow simulation (which may simply be referred to as "flow simulation") may provide useful information as to how hydrocarbons (i.e. gas and/or oil) flow in a reservoir environment. Flow simulation may for example represent real, estimated or predicted flow paths, flow rates, flowing compositions, and/or evolutions of these quantities over time.

In many existing solutions, flow simulation is performed based on geological simulation grids. Geological simulation grids comprise a geometrical grid which represents the geological environment. The geometrical grid may conform to shapes of geological structures, such as horizons, fault surfaces, channels and/or reservoirs. For example, horizons may correspond to layer structures of the geometrical grid and fault surfaces may correspond to stair-stepped structures of the geometrical grid. Geological simulation grids may further comprise parameters which represent geological properties of the geological structures, such as flow parameters, and which are assigned to geometrical structures of the geometrical grid. A geological simulation grid may be inputted to a flow simulator which performs the flow simulation, according to the shapes of the geometrical grid and/or to the values of the geological properties conveyed by the parameters.

Because of the size of the geological environments and the numbers of geological structures at stake, designing a geological simulation grid is a tedious task. Designing a geometrical grid in particular is time-consuming. Geometrical grids may indeed comprise more than ten million of cells in some situations. For this reason notably, the result is most often inaccurate, in the sense that simulations performed on the basis of a designed geological simulation grid are most often inaccurate.

Document US 2016/0103246 A1 for example recognizes that there may be a spatial discrepancy between a stair-stepped grid structure and a surface representing a discontinuity in a geological environment, such as a geological fault surface. The document proposes mapping the stair-stepped grid structure and the surface. This way, properties associated with the stair-stepped grid structure may be adjusted based on the mapping to compensate for the spatial discrepancy.

However, the technique presented by this document necessitates that an existing structure of the geometrical grid already conforms to the surface. As a result, the technique does not allow late-addition of information concerning a geological surface to a geological simulation grid having an already-designed geometrical grid.

Document US 2014/0136158 A1 presents a technique that allegedly allows such late-addition of information in reservoir models configured for finite element analysis involving discretization for performing coupled geomechanics and flow simulations. This technique consists in a method to generate a geological and reservoir model which comprises creating a numerical mesh that represents the generated geological model comprising delimitation associated with regions and layering of geology, without constraining the numerical mesh to explicitly represent a fault or fracture. The method may further comprise locating mesh elements from the numerical mesh that intersect one or more locations of one or more pre-existing geological faults or fractures. Mesh elements are then discretized according to a first or second numerical method depending on whether they were located as intersecting geological faults or fractures or not, before populating the numerical mesh elements with mechanical and flow properties. Such a method does allegedly not require an explicit representation of faults and fractures in the mesh and explicit re-meshing when the location of faults and fractures are changed during the workflow.

However, this document does not provide any detail on how to locate the mesh elements that intersect one or more locations of the one or more pre-existing geological faults or fractures, and in particular on how to address the combinatorial complexity of this task. Furthermore, accuracy may be improved.

Document WO 2018/134635 A1 by the present inventors presents a technique that allows late-addition of information. This document indeed discloses a computer-implemented method for designing a geological simulation grid. The method comprises providing a geometrical grid and a geometrical surface that represents a geological surface of the geological environment. The method also comprises identifying geometrical structures of the geometrical grid that each correspond to a respective location of the geometrical surface. The identified geometrical structures may be pairs of cells that represent the respective geological surface. The method may also comprise transferring to each identified pair of cells one or more respective parameters depending on the geological surface, such as a transmissibility value or multiplier (also referred to as "transmissivity" value/multiplier).

However, although this document provides implementation details to address combinatorial complexity and thereby already forms a significant improvement, there is still a need for yet an improvement when designing a geological simulation grid configured for hydrocarbon flow simulation in a geological environment.

SUMMARY OF THE INVENTION

It is therefore provided a computer-implemented method. The method comprises designing a geological simulation grid. The geological simulation grid is configured for hydrocarbon flow simulation in a geological environment. The designing of the geological simulation grid comprises providing a geometrical grid. The geometrical grid has cells and the geometrical grid represents the geological environment. The designing of the geological simulation grid also comprises providing a structural model. The structural model represents geological surfaces of the geological environment. The geological surfaces comprise one or more geological surfaces each in contact with at least one other geological surface. The designing of the geological simulation grid also comprises determining, for each geological surface of the structural model, pairs of cells that represent the geological surface. The pairs of cells determined for at least one respective geological surface in contact with at least one respective other geological surface each include a first cell and a second cell. The first cell and the second cell are located both on a same side of the at least one respective other geological surface.

Such a method improves the field of geological simulation, by allowing to design a geological simulation grid with relatively high accuracy.

Notably, the method allows representing geological surfaces of the geological environment in the geometrical grid, each with pairs of cells. The determined pairs of cells constitute data that can be based upon for performing one or more hydrocarbon flow simulations using the geometrical grid. By determining such data, the method allows to configure the geometrical grid into a geological simulation grid adapted for hydrocarbon flow simulation.

In addition, the method proposes that the geological surfaces provided for being represented in the geometrical grid comprise one or more particular geological surfaces. These one or more particular geological surfaces have the particularity of being each in contact with at least one other geological surface. This allows representation of diverse geological situations.

Now, the method does not represent these one or more particular geological surfaces in the geometrical grid in any way. Rather, the determining is performed in a way such that for at least one respective geological surface in contact with at least one respective other geological surface, for each determined pair of cells representing the at least one respective geological surface, both cells are located on a respective same side of the at least one respective other geological surface (rather than being located one cell on one side and the other cell on the other side). This allows an accurate representation of the zone where the geological surfaces are in contact. Indeed, if one uses a naïve approach for determining the pairs of cells, then the determined pairs of cells representing a part of the first or second geological surface corresponding to such a zone are possibly going to be located on either side of the other surface, due to the very fact that said zone corresponds to surfaces in contact. It was noticed that such a pair of cells often induces artefacts in the eventual simulation. By avoiding such a pair of cells for at least one considered geological surface, the method improves accuracy, at least for the representation of the considered geological surface. The method thus allows adequately taking into account contact information provided by the structural model.

In examples, the method may comprise one or more of the following:
- the geological surfaces also comprise one or more surfaces in contact with no other geological surface represented by the structural model;
- the designing of the geological simulation further comprises providing a hierarchy between the geological surfaces, the at least one respective other geological surface being higher in the hierarchy than the at least one respective geological surface;
- the at least one respective other geological surface comprises each geological surface in contact with and higher in the hierarchy than the at least one respective geological surface;
- the determining comprises: identifying a set of pairs of cells arranged along the at least one respective geological surface; and removing, from the set, each pair of cells including a first cell and second cell located on different sides of the at least one respective other geological surface;
- the designing of the geological simulation further comprises providing a hierarchy between the geological surfaces, and the removing comprises, for each identified pair of cells of the cell: a loop iterated on each geological surface in contact with and higher in the hierarchy than the at least one respective geological surface, an iteration of the loop comprising for a given geological surface:
  testing whether the identified pair of cells are located on different sides of the given geological surface;
  and if the test is positive, then eliminating the identified pair of cells and exiting the loop; alternatively if the test is negative, then continuing the loop;
- the at least one respective geological surface comprises each geological surface of the structural model in contact with at least one other geological surface;
- the designing of the geological simulation grid further comprises assigning, to each respective pair of cells of each respective geological surface, a transmissibility value or multiplier depending on the respective geological surface;
- the designing of the geological simulation grid further comprises determining flow panels based on the determined pairs of cells;
- determining each respective flow panel is performed via a neighborhood propagation from a starting cell;
- the neighborhood propagation comprises relative to an encountered cell: if the encountered cell is not present in the determined pairs of cells, adding all neighboring cells of the encountered cell to the respective flow panel, or if the encountered cell is present in the determined pairs of cells, adding all neighboring cells of the encountered cell to the respective flow panel except neighboring cells which form a determined pair of cells with the encountered cell;
- the method further comprises performing one or more hydrocarbon flow simulations based on the geological simulation grid;
- the method further comprises designing another geological simulation grid, the designing of the other geological simulation grid comprising: providing the geometrical grid; providing another structural model that represents geological surfaces of the geological environment, the geological surfaces comprising one or more geological surfaces each in contact with at least one other geological surface structural model; and performing the determining for each geological surface of the other structural model;
- the determining is performed for each geological surface of the other structural model without changing the geometrical grid;
- the method further comprises: performing a hydrocarbon flow simulation based on the geological simulation grid; and performing another hydrocarbon flow simulation based on the other geological simulation grid;
- the method further comprises comparing the hydrocarbon flow simulation and the other hydrocarbon flow simulation;
- providing the other structural model comprises: providing the structural model; and modifying the structural model;
- providing the geometrical grid comprises: providing a 3D volume and a resolution value; and gridding the 3D volume according to the resolution value; and/or the resolution value is computed based on the structural model and/or on the other structural model.

It is further provided a computer program comprising instructions for performing the method.

It is further provided a data structure representing any information obtainable by the method, such as a geological simulation grid designable or designed by the method and/or a result of a hydrocarbon flow simulation performable or performed by an example of the method which includes one or more hydrocarbon flow simulations.

It is further provided a data storage medium having recorded thereon the computer program and/or the data structure.

It is further provided a system comprising a processor coupled to a memory, the memory having recorded thereon the computer program and/or the data structure. The system may further comprise a display configured for displaying outputs of the method and/or a graphical user interface for entering inputs of the method.

It is further provided a hydrocarbon production process which comprises performing one or more iterations of the method. The process also comprises producing hydrocarbon based on the one or more iterations.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
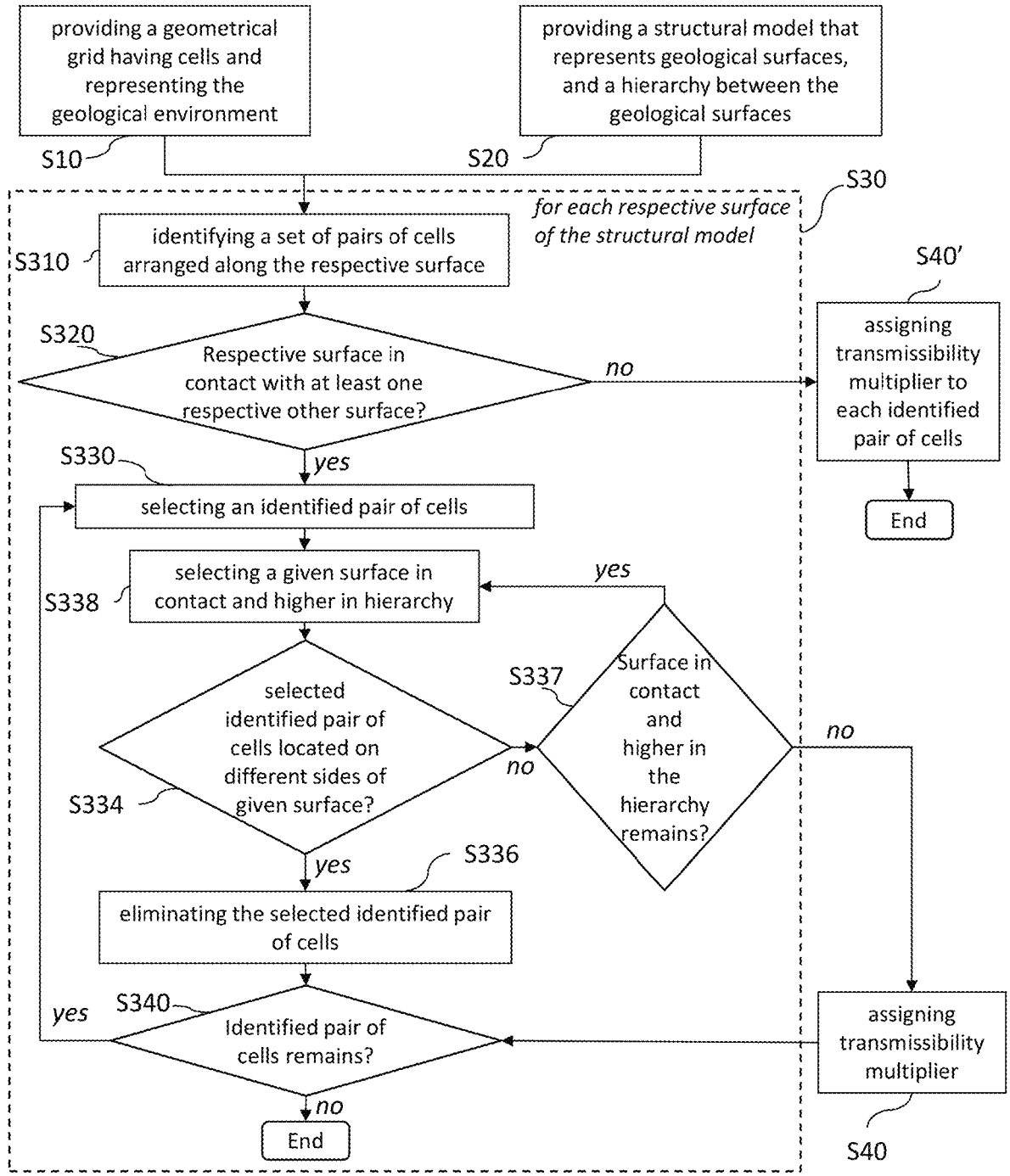
FIG. 1 shows a flowchart of an example of the method.

The teaching of document WO 2018/134635 A1 is incorporated by reference in its entirety.

The expression "designing a geological simulation grid" designates any operation participating to reaching a geological simulation grid configured for one or more types of hydrocarbon flow simulation, including but not limited to designs performed from scratch.

In examples, the method may comprise providing an initial version of the geological simulation grid, and then adding and/or modifying flow simulation information (i.e. information based upon which flow simulation may be performed), thereby obtaining a modified version of the geological simulation grid (which is also referred to by the expression "designing a geological simulation grid"). The initial version of the geological simulation grid may consist of the geometrical grid deprived of any flow simulation information (thus constituting a "virgin" geological simulation grid) or alternatively with already-present flow simulation information. The initial (respectively modified) version of the geological simulation grid may be read from (respectively recorded/written on) computer memory and/or received from (respectively sent to) a distant computer system, for example in one or more data files, before (respectively after) such obtention of the modified version of the geological simulation grid.

The determined pairs of cells for example constitute such flow simulation information. The method may notably result in the creation of a data structure identifying for each geological surface of the structural model, a respective set of one or more pairs of cells that represent the geological surface. For example, the method may construct, for each such respective set of cell pairs, a respective data object specifying said respective set of cell pairs. Alternatively, the method may create and/or populate a lookup table, e.g. indicating relations between cells and/or geological surfaces so as to provide the information. Each pair of cells represents a respective location of the geological surface. Such information may be relied upon by the flow simulation.

The geological environment may be any geological environment of interest, for example any subsoil, for example a subsoil comprising, consisting or forming a part of one or more hydrocarbon fields, such as oil and/or gas field(s).

The geological environment comprises geological structures. A geological structure is a formation in the geological environment that is of interest to any geological phenomenon that may occur in the geological environment. Any geological structure contemplated by the method may be a reservoir, a horizon, an unconformity, an intrusion, a channel, a salt diapirism, a fold, a fault or yet a zone of steam presence or a front surface thereof in a steam-assisted gravity drainage (SAGD) situation. Any geological structure contemplated by the method may consist of or be delimited by one or more geological surfaces.

The geological surface may for example be a fault surface, a horizon surface, a geological body surface—such as a reservoir property boundary surface, a salt diapirism surface, or a channel surface-, or a front surface of a steam presence zone. The geological surface may be of a dimension superior to 100, 1.000 or 10.000 m$^2$ and/or inferior to 10.000.000 or 100.000.000 m$^2$, for example of the order of 1.000.000 m$^2$ (e.g. ±50%, 25% or 10%).

A structural model is a data structure representing geological structures of the geological environment and a spatial arrangement thereof. For example, any structural model contemplated by the method may represent a plurality of (i.e. at least two) geological surfaces each constituting or delimiting one or more of the geological structures. The structural model may for example comprise, for each geological surface, specifications of a respective geometrical surface, and specifications of a reference space where the respective geometrical surfaces are positioned, such as a cuboid, the reference space representing the geological environment. The reference space may be the same for all geological structures of the structural model.

The geological simulation grid is any data structure that comprises a geometrical grid and that is configured for one or more hydrocarbon flow simulations contemplated to be performed with respect to the geological environment. The geological simulation grid may optionally also comprise parameters assigned to geometrical structures of the geometrical grid and that represent geological properties. The geometrical grid and its possibly assigned parameters are adapted to be inputted to one or more hydrocarbon flow simulators, which may in any known way perform flow simulations based upon the available data.

The geometrical grid is a data structure that represents the geological environment by a spatial distribution of geometrical cells. The geometrical grid and/or the geometrical cells may be of any dimension, for example three-dimensional. Each geometrical cell represents a respective real cell of the geological environment. All or a part of the geometrical cells of the geometrical grid may be of a cuboid or an at least substantially cuboid shape. One or more of the dimensions of all or a part of the geometrical cells may be superior to 1 meter, 2 meters, or 5 meters and/or inferior to 1000 meters, 500 meters, or 200 meters. The geometrical cells may for example be of a cuboid shape, and/or of dimensions of the order of 80 meters×80 meters×10 meters (e.g. ±50%, 25% or 10% for each dimension). The geometrical grid may comprise more than 10000, 100000 or yet 1000000 geometrical cells. The geometrical grid may comprise less than 100 000000 or 50000000 cells. The number of cells may be of the order of 10000000 (e.g. ±50%, 25% or 10%). All, substantially all, or at least a majority of the cuboid cells may be positioned horizontally or at least substantially horizontally. The geometrical grid may be regular or irregular, and/or structured or unstructured.

The geometrical grid may optionally conform to a reference set of geological structures of the geological environment (the reference set being for example any set comprising geological structures of interest to the contemplated one or more flow simulations, that is, geological structures corresponding to the one or more flow simulations). This means as known per se that the gridding is constrained by the reference set of geological structures, such that for each given geological structure of the set, a corresponding geometrical structure of the geometrical grid conforms to the given geological structure. Optionally, such geometrical structures may be marked accordingly, that is to convey such correspondence information.

A geometrical structure of the geometrical grid is any one or any combination of one or more cells, one or more faces, one or more edges, and/or one or more vertices. A geometrical structure conforms to a given geological structure when the geometrical structure matches at least substantially the given geological structure. A given geometrical structure matches at least substantially a given geological structure when the spatial discrepancy between the given geometrical structure and the given geological structure is inferior or equal to a predetermined threshold.

The spatial discrepancy may for example be measured as the Hausdorff distance between surfaces representing respectively the given geometrical structure and the given geological structure. In such a case, the predetermined threshold may be a value above 1 m or 10 m and/or below 25 m or 50 m. The spatial discrepancy may alternatively be measured as the sum, over all grid cells intersected by the surface representing the given geological structure, of the absolute cell volumes displaced across the surface representing the given geological structure by position discrepancy with respect to the given geometrical structure. In such a case, the predetermined threshold may be a value above 10 m$^3$ or 100 m$^3$ and/or below 500 m$^3$ or 1000 m$^3$ times the number of affected cells.

The geometrical grid may be a grid obtainable based on the reference set of geological structures (e.g. excluding the use of any other geological structure data). For example, providing the geometrical grid may comprise, prior to providing the structural model, providing another structural model (referred to as "initial" structural model) representing the reference set of geological structures (e.g. built from scratch, retrieved from a memory or received from a distant system), and then gridding the initial structural model, thereby obtaining the geometrical grid. Alternatively, the result of such a prior stage may be provided as such, for example retrieved from a memory or received from a distant system. In the following, the structural model provided by the method and that represents geological surfaces for which the pairs of cells are determined may also be referred to as "subsequent" structural model, independently of whether the method comprises providing the initial structural model or not.

The subsequent structural model may comprise a plurality of geometrical surfaces each representing a respective geological surface of the geological environment. Each geometrical surface may be provided with positioning information relative to the geometrical grid. For example, the geometrical surface and the geometrical grid may be provided positioned in a same referential space. Notably, the subsequent structural model may comprise geometrical surfaces defined in a respective cuboid, the respective cuboid matching the boundary of the geometrical grid (e.g. the cuboid of the initial structural model) or a connected subset of cells of the geometrical grid (e.g. corresponding to a specific zone of interest for flow simulation). This allows performing the determining of pairs of cells. Different locations of one or more (e.g. all) geometrical surfaces intersect different geometrical structures of the geometrical grid. The determining of the pairs of cells may be based on such local intersections between the geometrical surface and the geometrical grid.

One or more (e.g. each) geometrical surfaces may be composed of discrete elements, each corresponding to a respective location of the geometrical surface. A geometrical surface may for example be provided as a mesh, for example as a triangular mesh (i.e. each discrete element being a triangle). The number of discrete elements may be superior to 5000, 1000000, or 10000000 and/or inferior to 20000, 50000000, or 200000000, for example between 1000000 and 10000000 for a complex fault surface or a geological body surface, between 5000 and 20000 for a simple fault surface, between 10000000 and 50000000 for a local horizon surface, and between 50000000 and 10000000 for a regional horizon surface.

The geological surfaces represented by the subsequent structural model comprise one or more geological surfaces each in contact with at least one other geological surface. The subsequent structural model may thus represent one or more geological surfaces in contact with one or more other surfaces represented in the subsequent structural model. In examples, the subsequent structural model may also represent one or more geological surfaces not in contact with any other geological surface represented in the subsequent structural model.

The designing of the geological simulation grid may in examples comprise providing contact information. Providing contact information may comprise retrieving contact information (readily) represented by the subsequent structural model (i.e. directly, via specific data of the subsequent structural model), and/or determining contact information from the subsequent structural model (i.e. indirectly, via computations involving data of the subsequent structural model). The contact information may comprise identification of the one or more geological surfaces in contact with at least one other geological surface, and/or identification of said at least one other geological surface, and/or identification of geological surfaces in contact with no other geological surface represented in the subsequent structural model. For example, the contact information may comprise a list of pairs of geological surfaces in contact one with another. The contact information may optionally comprise a type of contact for each such pair (e.g. a geometrical description of the contact) and/or a location of contact.

As known from the field of geology, geological surfaces of the geological environment may be in contact one with another. For example, types of contact for two geological surfaces may include one surface connecting to (or arriving at) the other surface (at least substantially), both surfaces crossing each other (at least substantially), and/or both surfaces being substantially tangent to each other (at least substantially). The contact information may be provided by one or more geologists or derived from information provided by one or more geologists.

A contact between two geological surfaces may result from geological processes (i.e. processes deforming and moving geological structures of the environment). One or more first geological processes may result in a first geological surface at a first location. One or more second geological processes (at least one second geological process being subsequent to at least one first geological process) may result in a second geological surface at a second location. During the one or more second geological processes, the first geological surface may or may not be modified (e.g. reshaped and/or moved). At the end of the one or more second geological processes, the second geological surface may be in contact with the first geological surface.

In examples, at least one geological surface is a fault in contact with another geological surface which is another fault, or a horizon, or a boundary of a fold. For example, two fault surfaces may be in contact because one is primary and the other secondary, for example when a new tectonic event induces new faults in an already faulted environment, because there is a branching, such as in the case of main and transfer faults, or because two faults are conjugated. As another example, a fault may be in contact with a horizon because the fault fractures the layer to which the horizon belongs, or because the fault propagation stops at a given interface represented by the horizon. As yet another example, erosions and other unconformities create branching contacts between horizons, and salt propagation such as diapirism can create branching contacts between the surface representing the salt and horizons or faults.

In examples, pairs of geological surfaces in contact may be those represented in the subsequent structural model each by a pair of geometrical surfaces sharing a cell-to-cell connection.

Now, the method imposes a constraint to the determining of pairs of cells relative to how cells are located respective to some surfaces. During the determining, a cell may be considered located on a given side of a given surface (i.e. a respective one of the two parts of the geological environment delimited by the given surface) if, and only if:

The whole cell is located on said given side of said given surface;

A center (e.g. the barycenter) of the cell is located on said given side of said given surface; or A majority (e.g. of the volume, e.g. more than 50% of the volume) of the cell is located on said given side of said given surface.

The constraint is that for at least one respective geological surface ("first" surface in the following) in contact with at least one respective other geological surface ("second" surface in the following), the pairs of cells determined for the first surface each include a first cell and a second cell located both on a same side of the second surface. In other words, for any cell pair (i.e. each one of all cell pairs) representing the first surface, the two cells of the pair (the abovementioned "first cell" and "second cell") are both located on an identical side of the second surface (optionally with some pair(s) of the first surface located on one side of the second surface and some other pair(s) of the first surface located on the other side of the second surface, or alternatively with all pair(s) of the first surface located on one common side of the second surface). This constraint improves accuracy of the overall representation of the first and second surfaces, and ultimately accuracy of the flow simulation.

Indeed, the method ensures that no cell pair representing the first surface overlaps the second surface (i.e. the method prevents that the two cells of the pair are located on both sides of the second surface). Cells that would be involved in such overlapping pairs are thus, if any, only actually involved in pairs that represent the second surface. The method thus reduces risk that a cell be used for representing both the first surface and the second surface (each together with another same or different cell). Accuracy of the eventual simulation is increased by proceeding this way.

In examples, for each respective geological surface ("first" surface) of the subsequent structural model in contact with at least one respective other geological surface ("second" surface), the pairs of cells determined for the first surface each include a first cell and a second cell located both on a same side of the second surface (in other words, the constraint is imposed on the first surface relative to the second surface), and/or the pairs of cells determined for the second surface each include a first cell and a second cell located both on a same side of the first surface (in other words, the constraint is imposed on the second surface relative to the first surface). In other words, for each pair of two geological surfaces of the subsequent structural model, the constraint is imposed on at least one of the two geological surfaces relative to the other one. This allows yet reducing artefacts.

In specific examples, either the pairs of cells determined for the first surface each include a first cell and a second cell located both on a same side of the second surface or alternatively the pairs of cells determined for the second surface each include a first cell and a second cell located both on a same side of the first surface (in other words, the constraint is imposed on only one of the surfaces relative to the other). In other words, for each pair of two geological surfaces of the subsequent structural model, the constraint is imposed on one and only one of the two geological surfaces relative to the other one. This reduces risks that more than artefacts are removed and thereby improves accuracy.

The designing of the geological simulation may in examples comprise providing a hierarchy between the geological surfaces. Providing the hierarchy may comprise retrieving a hierarchy (readily) represented by the subsequent structural model (i.e. directly via specific data of the subsequent structural model), and/or determining a hierarchy from the subsequent structural model (i.e. indirectly, via computations involving data of the subsequent structural model).

The hierarchy is any information that represents, for each respective pair having a first surface and a second surface, among one or more (i.e. all) pairs of geological surfaces of the subsequent structural model in contact one with another, a hierarchy (or "ranking" or yet "order") between the first surface and the second surface with respect to their contact. For any such pair, the hierarchy thereby allows defining a geological surface (strictly) higher than the other geological surface, hierarchically speaking.

In such examples, for at least one (e.g. several, for example all) first surface(s) in contact with at least one second surface and for which the determining is constrained such that the pairs of cells determined for the first surface each include a first cell and a second cell located both on a same side of the second surface, the second surface may be higher in the hierarchy than the first surface. In particular, the determining may be constrained for each of one or more (e.g. all) such first surfaces such that, for each respective second surface in contact with and higher in the hierarchy than the first surface, the pairs of cells determined for the first surface each include a first cell and a second cell located both on a same side of the respective second surface. This allows integration of hierarchy information in the representation of the surfaces and thereby offers control on the reduction of artefacts provided by the method.

The hierarchy between a first geological surface and a second geological surface may be based on any geological information. The hierarchy may convey the information that one of the surfaces is geologically considered as a main surface relative to the other, for example if the boundary of one surface lies partially on the other surface. The hierarchy may be provided by one or more geologists or derived from information provided by one or more geologists. It was observed that integrating such geological information in the simulation model improved accuracy of the eventual flow simulation.

In applications of the method, the subsequent structural model may represent a first plurality of geological surfaces in contact together. In addition, the subsequent structural model may represent a second plurality of geological surfaces in contact together with no surface of the second plurality in contact with a surface of the first plurality, and/or the first plurality may comprise at least three surfaces with a hierarchy between each pair of them. In such applications, the examples of the method allow optimal integration of contact and hierarchy information conveyed by the subsequent structural model, thereby leading to accurate representations of surfaces.

In examples, the geological surfaces represented by the subsequent structural model may comprise one or more instances of pairs of surfaces in contact together and each having a first surface and a second surface, the second surface being higher in the hierarchy than the first surface. The boundary of the second surface may lie at least partially on the first surface The set of geological surfaces represented by the subsequent structural model (referred to as "subsequent surfaces") may optionally be different from the optional reference set of geological structures to which the geometrical grid conforms. In examples, at least one (e.g. several) of the subsequent surfaces (e.g. including one or more subsequent surfaces each with at least one other subsequent surface) may be outside (i.e. not included in) the reference set. In other words, the at least one geological surface is not based upon when obtaining the geometrical grid, for example it is not used in the building of the initial structural model (in other words, the geometrical grid is the result of gridding a structural model of a reference set of geological structures from which the at least one geological surface is excluded). In examples, the at least one geological surface is unaligned with the reference set of geological structures. This means that the spatial discrepancy between the at least one geological surface and any geological structure of the set is strictly superior to the earlier-mentioned predetermined spatial discrepancy threshold. In examples, the gridding does not conform to the at least one geological surface, at least for a part of the geological surface.

In such a case, the method provided herein does not necessitate that an existing structure of the geometrical grid conforms to the set of subsequent surfaces. The method provided herein indeed processes at least one geological surface which is outside the reference set of geological structures. The method thus allows late-addition of information related to at least one geological surface to a geological simulation grid having an already-designed geometrical grid.

For example, the at least one geological surface may be provided based on data obtained after a determination of the geometrical grid. The method may for example be encompassed in a global process comprising: obtaining data relative to the reference set of geological structures of a geological environment to which the geometrical grid is to conform, then determining the geometrical grid to conform to said reference set of geological structures (e.g. via structural modeling and gridding as mentioned above), and then only obtaining data relative to the at least one geological surface. Said data relative to the at least one geological surface may be obtained via new measurements on the geological environment, new interpretations and/or new calculations based on previous measurements, and/or new reception from a third party and/or a distant system. The measurements may comprise seismic data measurements. The method allows in such cases to configure a previously-built geometrical grid with information relative to at least one geological surface which was unknown at the time of building the geometrical grid.

Alternatively, the data may be already present but discarded at the time of determining the geometrical grid in the global process. For example, an initial number of geological structures including the at least one geological surface may be provided before determining the geometrical grid, e.g. consisting of all known geological structures of the geological environment. The global process may then comprise forming a set of said geological structures excluding the geological surface. For example, the global process may comprise selecting geological structures (excluding at least the geological surface), for example less than 75%, 50% or yet 25% of the initial number of known geological structures, for example consisting of most promising geological structures for the simulations to be accurate. The global process may then determine the geometrical grid to conform to said selected geological structures. The excluded at least one geological surface may then be used any time later, e.g. based on any assessment that such use should be made. This allows an incremental design of the geological simulation grid, rather than a design taking all information into account from the beginning. This allows a faster determination of the geometrical grid, as it is based on relatively less data. This also allows reaching a geometrical grid which has relatively fewer cells, as fewer constraints are imposed. Such a geometrical grid may then be processed faster and/or lead to more accurate results during simulations.

In examples, for each of one or more (e.g. all) geological surfaces of the structural model, the determining of pairs of cells that represent the geological surface may comprise identifying a set of pairs of cells arranged along the geological surface (referred to as "the identifying" in the following). The constraint regarding cell pairs for contacting surfaces may be integrated in any way to the determining. For example, the determining may further comprise removing, from the set identified for one or more (e.g. all) surfaces in contact with at least one other surface and for which the constraint of being represented by cell pairs whose cells are both on a same side of the at least one other geological surface, all cell pairs not meeting the constraint (if any)—i.e. each pair of cells including a first cell and second cell located on different sides of the at least one other geological surface.

By "a set of pairs of cells arranged along a given surface", it is meant a series of cell pairs that extends so as to form a shape representing the given surface, the cell pairs optionally covering at least partly (e.g. fully) the given surface.

Such identifying may be performed as taught by document WO 2018/134635 A1. In other words, the identifying may, for each of one or more (e.g. all) geological surfaces, consist of identifying cell pairs of the geometrical grid that each correspond to a respective location of a geometrical surface that represents the geological surface and that is composed of discrete elements.

This performs in a relatively simple way (instead for example of re-designing the geometrical grid to make sure that a structure of the geometrical grid conforms to the geological surface as well). The method thus offers a computationally cheap alternative to re-designing the geological simulation grid from scratch. Furthermore, the method may perform whichever the geometry of the subsequent geological surfaces. The method may perform notably even if the geometrical structures of the geometrical grid corresponding to the subsequent surfaces do not form a stair-stepped grid structure. The method can thus be applied for any type of geological surface. Similarly, the method may perform whichever the geometry of the geometrical grid. The method may perform notably even if the geometrical grid is irregular or yet unstructured.

As taught by document WO 2018/134635 A1, the identifying may in options comprise any one or any combination of the following features, for each of one or more surfaces:
- the identifying includes determining cells of the geometrical grid that each intersect a respective discrete element;
- the identifying further includes determining pairs of cells each including a respective first cell that intersects a respective discrete element and has a center located on one side of the geometrical surface and a respective second cell that is a neighbor of the respective first cell (two geometrical structures such as cells being said to be neighbors or geometric neighbors if they have a non-null intersection, for example cells sharing at least part of a face together, neighboring information being for example provided among topological data defining the grid) and has a center located on the other side of the geometrical surface;
- the determining of cells of the geometrical grid that each intersect a respective discrete element is iterated over the discrete elements via one or more neighborhood propagations over the discrete elements of the geometrical surface (a neighborhood propagation being a scheme comprising visiting geometrical structures from neighbor to neighbor);
- at each non-starting iteration of each neighborhood propagation over the discrete elements of the geometrical surface, the determining of cells of the geometrical grid that each intersect a respective discrete element includes using cells determined at the previous iteration; and/or
- at each non-starting iteration of each neighborhood propagation over the discrete elements of the geometrical surface, the determining of cells of the geometrical grid that each intersect a respective discrete element is performed via a neighborhood propagation on the cells of the grid.

In examples, the identifying may be performed after initially constructing a space search structure. The construction may be performed only once, such that the same initial space search structures may be used for all the geological surfaces of the subsequent structural model.

Any such feature may be implemented according to any teaching of document WO 2018/134635 A1. For example, the identifying may be performed for each of one or more (e.g. all) geological surfaces, according to the "example of implementation of the method" taught in document WO 2018/134635 A1 and for which pseudo-code that allows running the identifying is provided.

The identifying may thus conveniently consist of applying the algorithm of document WO 2018/134635 A1 and filtering out, from the set of pairs of cells respective to a first geological surface respective to at least one contact, one or more pairs of cells, each for which the cells are not located on a same side of a second geological surface respective to said at least one contact.

In examples, the subsequent structural model may represent a plurality of geological surfaces which comprise more than 50, 200 or 500 surfaces. The computational performance of the method allows handling such high numbers.

The geological simulation grid is configured for hydrocarbon flow simulation in a geological environment. As known per se, hydrocarbon flow simulation or "flow simulation" designates any process which simulates how fluids including hydrocarbon flow in the geological environment.

In examples, the geological simulation grid may be configured for finite volume hydrocarbon flow simulation, and optionally one or more (e.g. each) flow simulation performed by the method may be a finite volume hydrocarbon flow simulation. As known per se, finite volume flow simulation is a specific type of flow simulation which takes as input a geological simulation grid including a geometrical grid having cells, and which comprises an iterative calculation to compute a discrete step by step evolution or cell properties from which flow may be derived, based on one or more parameters assigned (e.g. during the simulation or beforehand) to geometrical structures of the geometrical grid. At each time step of the simulation, properties are uniform within each cell of the model, such that finite volume simulation does not necessitate and excludes discretization of cells during the iterative calculation. In particular, during finite volume simulation, the geometrical grid of the geological simulation grid may remain constant (i.e. geometry of the cells is not modified). As a result, finite volume simulation performs relatively fast (for example compared to other numeric schemes such as finite element algorithms). Also, the results between different simulations are easily comparable since they pertain to the same meshing of the environment (the geometry of the cells being unmodified).

The geological simulation grid may thus in examples form a numerical reservoir simulation model which is a discretized model of a reservoir containing oil, gas, water or any combination, subdivided into cells. Each of the cells represents a corresponding volume of the reservoir. Cells are either connected or disconnected to other cells, geometric neighbors or not, so that fluid may flow from cell to cell. The fluids and rocks descriptions and distributions may be included in the model in the form of cell properties or look up tables. The simulation process is a computerized iterative calculation that takes injected volumes and constraints in producers/injectors bottom hole pressures to compute a discrete step by step evolution of pressure and saturations in each cell of the model. The time step may correspond to the time required to fill the smallest cell.

The simulation may output the following data:
- the average field pressure as a function of time;
- the total field cumulative oil, water and gas production profiles with time;
- the total field daily (weekly, monthly, annual) production rates of each phase: oil, water and gas;

the individual well pressures (bottom hole or, through lift curves, wellhead) over time;

the individual well cumulative and daily flowrates of oil, water and gas with time;

either full field or individual well watercuts, GORs, O/W ratios with time; and/or the spatial distribution of oil, water and gas saturations throughout the reservoir as functions of time i.e. So(x, y,z;t), Sw(x,y,z;t) and Sg(x,y,z;t).

At every step, first the gradient of the pressure may be estimated from the current pressure values in the cells. The gradient of pressure may then be used to decide how much fluid flows from each cell to each of its connected cells. Finally, fluid saturations may be updated and pressure may be recomputed from the new configuration.

In examples, the geometrical grid may be provided with an initial set of parameters each assigned to a respective geometrical structure of the geometrical grid. The initial set of parameters may represent geological properties of the reference set of geological structures to which the geometrical grid conforms, and/or more generally any local property of the geological environment. Each parameter is a value of a respective property of a respective geological structure. For example, porosity, permeability, density and/or facies, net-to-gross values may be assigned to cells. Transmissibility values may be assigned to cell pairs.

The method may comprise transferring, to each cell pair determined as corresponding to a respective location of a geometrical surface, a respective parameter value. The method thus late-configures a geological simulation grid with respect to such geological properties of a geological surface.

This may be performed according to any of the now discussed examples taught by document WO 2018/134635 A1 and that allow a differentiated and refined transfer of parameters.

In examples, a parameter (e.g. transmissibility multiplier) transferred to a determined geometrical structure of the grid (e.g. a cell pair) may depend on a size of the respective location of the geological surface which corresponds to said determined geometrical structure of the grid (e.g. a cell pair). This allows taking into account the extent to which the geological surface corresponds to the geometrical structure. For example, a fault surface represented by different cell pairs may impact the assignment of transmissibility multipliers to the cell pairs differently according to the extent to which the surface intersect a cell of each of the pairs (the larger the intersection, the larger the impact). In examples, the parameter value transferred to a given interface may be a (e.g. proportionally) decreasing function of the area size of the fault surface identified by the method as corresponding to said given interface.

Alternatively or additionally, at least one property of the geological surface may vary locally (i.e. the value of the property is not constant over the surface but varies geographically). In such a case, if such local variation is known and such knowledge is provided together with the geometrical surface, each of the transferred parameters corresponding to said property (e.g. transmissibility multiplier) may be a local value, thereby following the variation of the property itself. This allows taking into account the local character of the property. For example, a fault surface may have a varying fault throw. A parameter which represents the transmissibility may thereby vary accordingly when transferred to cell pairs of the geometrical grid that correspond to the fault surface. This allows to relate the local flow properties (example: fault transmissibilities, "unconformities") with the local properties of the subsequent structural model (example: shale gouge ratio or other geological parameters).

In examples, the designing of the geological simulation grid may comprise assigning, to each respective pair of cells determined as representing a respective geological surface, a transmissibility multiplier depending on the respective geological surface (i.e. a value of transmissibility that is a function of one or more characteristics of the geological surface). The transmissibility multiplier is a parameter which impacts how fluid flows from one cell of the pair to the other cell of the pair. As known per se, finite volume hydrocarbon flow simulation may be performed on grids with such parameters assigned to cell pairs. Transmissibility values allow to represent geological phenomena in the flow simulation, for example due to the presence of specific geological structures. Such examples of the method thus allow to adapt transmissibility behavior of the grid during ulterior flow simulation(s) to the knowledge of presence of geological structures provided by the structural model.

By "assigning a transmissibility multiplier to a respective pair of cells", it is meant that a value of transmissibility is transferred to the pair of cells, or yet that the pair of cells is associated with said value in the data structure constituting the geological grid, for example via a data link. In case the pair of cells is already assigned with one or more previous transmissibility multipliers (e.g. from beforehand), then a new multiplier may replace them. The new multiplier is a function of all the multipliers, for example, the last multiplier, the composition of all the multipliers, the maximum, minimum, or some average multiplier, depending on the situation.

The assignment of a transmissibility multiplier to a cell pair may depend on the geological surface type and/or on one or more geological quantities of the geological surface. A fault surface may for example be associated with a low transmissibility value, constituting a barrier to hydrocarbon flow across the surface. The method may model this by transferring a low transmissibility multiplier, for example to all pairs of cells of the geometrical grid that correspond to the fault surface. For a fault surface for example, the transmissibility multiplier assigned to a cell pair may be a function of the fault downthrow, the volume of shale, the rejection and/or the shale gouge ratio. For a surface representing a channel, for example, the transmissibility multiplier can be a function of the shale content of the channel bed. The transmissibility multiplier may notably be assigned as a function of variability of any one or more of these geological quantities. The transmissibility multiplier "t" can be given by the formula t=f(geological property)*k(intersection area). For example, "k" can be the constant function "1" for extensive properties such as surface thickness, or the function "area/(total area)" for intensive properties such as fault throw or shale gouge ratio. For example, in a fault "f" can be a constant or a linear or polynomial function of the shale gouge ratio or the fault throw, with parameters that need to be determined experimentally and/or through numerical simulations. For example, for the surface of a channel, "f" can be "zero", all transmissibility, or "one" to allow it without modification, or for example it can be a linear or polynomial function of the sand and/or shale content of the channel bedding.

The assignment of a transmissibility multiplier may be performed as taught by document WO 2018/134635 A1, and thus in examples interlaced with the identification of cell pairs taught by document WO 2018/134635 A1. In case a cell pair representing a first surface in contact with a second surface is removed because the cell pair is located on both sides of the second surface, then the transferring of the transmissibility multiplier for that cell pair taught by document WO 2018/134635 A1 may be either not performed, or performed and then cancelled.

FIG. 1 shows an algorithmically efficient example of the method.

The example method starts with providing S10 a geometrical grid having cells and representing the geological environment, and providing S20 a structural model.

The structural model represents geological surfaces comprising one or more geological surfaces each in contact with at least one other geological surface, and a hierarchy between the geological surfaces.

The example method then comprises a scheme S30 iterated on each respective surface of the structural model. Scheme S30 allows determining, for each geological surface of the structural model, pairs of cells that represent the geological surface. Scheme S30 further ensures that for each first surface in contact with at least one second surface higher in the hierarchy, then for each such second surface, each pair of cells of the first surface includes a first cell and a second cell located both on a same side of the second surface.

Scheme S30 comprises identifying S310 a set of pairs of cells arranged along the respective surface. The identifying S310 can be performed as taught by document WO 2018/134635 A1. The set of cell pairs may be associated (in the data structure, e.g. via any data link structure) to the respective surface for its representation, e.g. said set being possibly initialized at the beginning of S30 and populated at S310.

Scheme S30 then comprises testing S320 whether the respective surface is in contact with at least one respective other surface. If the test is negative (i.e. the result of the test is negative), then the example method exists scheme S30 and comprises assigning S40' a transmissibility multiplier to each identified pair of cells as described earlier. Otherwise, the method continues inside scheme S30 with removing S330-S340, from the set, each pair of cells (if any) including a first cell and second cell located on different sides of the at least one respective other geological surface.

The removing S330-S340 comprises first selecting S330 a pair of cells identified at S310. The removing S330-S340 then comprises a loop S334-S338 iterated on each geological surface (if any) in contact with and higher in the hierarchy than the respective geological surface. By "a loop iterated on each surface", it is meant an algorithmic loop, that is an algorithm comprising a set of steps and configured for running on each surface (provided that no step for exiting the loop is reached during the algorithm).

Each iteration of the loop comprises selecting S338 a given surface in contact with the respective surface and higher in hierarchy. The iteration then comprises testing S334 whether the two cells of the selected identified pair of cells are located on different sides of the given surface. If test S334 is negative, then the method simply continues with the loop. If otherwise the result of the test is positive, then the iteration eliminates S336 (from the set of cell pairs representing the respective surface) said selected identified pair of cells and the method exits the loop. This allows not visiting surfaces higher in the hierarchy for an identified pair of cells when unnecessary and thus saving time.

By "continuing with the loop", it is meant that the method keeps (i.e. does not eliminate) said selected identified pair of cells as a result of it being evaluated at S334 to be well-positioned relative to the given surface, and that the method executes the next iteration (if any) of the loop, that is an iteration with respect to a new given surface (if any). If no new given surface is available, then the loop simply comes to an end. Continuing the loop here comprises testing S337 whether there remains a surface in contact with the respective surface and higher in the hierarchy. If this is the case, the method then goes back to the surface selection step S338 and repeats the algorithm of the loop for the new given surface selected. Otherwise, the loop comes to an end and the identified pair of cells selected at S330 is kept among the the set of cell pairs representing the respective surface. In that situation, the method can go to assigning S40 a transmissibility multiplier to the identified pair of cells selected at S330, as described earlier.

Eventually, the method tests S340 whether there remains a pair of cells identified at S310. If this is the case, a new cell pair is selected S330 among those available and the loop is repeated.

Although shown sequentially on the flowchart of FIG. 1, the assignment S40,S40' of transmissibility multipliers may be performed interlaced with the identifying S310, as taught by document WO 2018/134635 A1. In other words, as soon as a cell pair is identified at S310, a transmissibility multiplier may be assigned. Then, as soon as a cell pair is eliminated at S336, its transmissibility multiplier may be modified accordingly (e.g. deleted or brought to zero). This reduces computational time.

Examples of the method address a general unstructured (face to face non-conformal—with internal boundaries—cell complex) simulation grid with several connected components and a structural model (collection of geological surfaces with contacts and contact hierarchy). The structural model has properties on the geological surfaces that affect the flow simulation. The method allows to modify the simulation by changing the cell to cell connection parameters according to the structural model with properties and their positions, connections and hierarchy.

The method may be directed to a stair-step representation method of a structural model composed of:
  a set of discrete surfaces and their properties;
  a geometric description of the contacts between these surfaces, of the type (but not limited to): "surface A connects to surface B"; and
  a hierarchy between the surfaces, of the type (but not limited to) "surface A is the main surface with respect to surface B" in the simulator grid.

The grid can be structured or unstructured, with or without non-neighbor connections. The subsequent structural model may represent an area of interest (potentially the entire area) in the flow simulation. The surfaces composing the subsequent structural model may have been used in the construction of the grid or may be introduced afterwards.

The method may allow to:
  1) represent a structural model in the simulator grid (structured or unstructured)
  2) transfer the properties of the subsequent structural model to the simulator grid The method may allow representing a fault while supporting unstructured grids or surfaces that are not aligned with the grid structure. The method may permit a flow simulation thanks to a determination of pairs of cells forming a "stair-step" representation of a surface. The method may allow to transfer properties from the surface to the grid, rather than simply modifying existing properties. The method may take into account an entire structural model, with contacts between geological surfaces, and a hierarchy. The method may respect these contacts and this hierarchy and thus produce connections in the grid which respect the whole structural model (topology, hierarchy) and not only the surfaces taken singularly. The method may exclude any discretizing steps and any coupled flow and geomechanical simulations. The method may even be prevented do this type of simulations, because the geological grid may be deprived of any mechanical properties. Moreover, the method may be prevented to modify properties inside cells, but only allowed to modify properties on the connections between cells. The method may deal with "finite volume" simulations (which is the only method used in the industry outside R&D). The method may thus present high applicability. With the method, results may be perfectly compatible between different runs (since the method may use the finite volumes before and after different simulations). The method may leave intact properties in the mesh (or geometry or resolution method), and it may just output a set of cell-to-cell connections, with properties transferred from the surface.

In implementations in line with the example of FIG. 1, the method may include the following steps:
  a) For each surface, the method proposed in document WO 2018/134635 A1 is used to find the pairs of neighboring cells intercepting the surface. According to the cited document, in each pair at least one cell in each pair intercepts the surface directly, and the two cells are on opposite sides of the surface.
  b) For each pair, we consider all the surfaces of the subsequent structural model that are higher in the hierarchy of contacts.
  c) For each surface higher in the hierarchy, if the cells of the pair are not on the same side of this surface, the pair is eliminated from the list.
  d) The surface is represented in the simulator grid (using the list of cells after filtering, in line with the cited document.
  e) The representation of the subsequent structural model in the form of connections, with its properties, its contacts and its hierarchy, can be visualized by displaying the common surface between the cells of the pairs determined in the previous step. In grids with "non-neighbor" type connections, the method may allow a direct visualization of the subsequent structural model represented in the grid by cutting out the shared faces of the cells of each pair. This allows to perform a QC step of the contacts and the geological hierarchy directly on the simulation grid.
  f) Properties are transferred from cells following the approach of the cited document.

FIGS. 2-5 illustrate these implementations.

Figure 2:
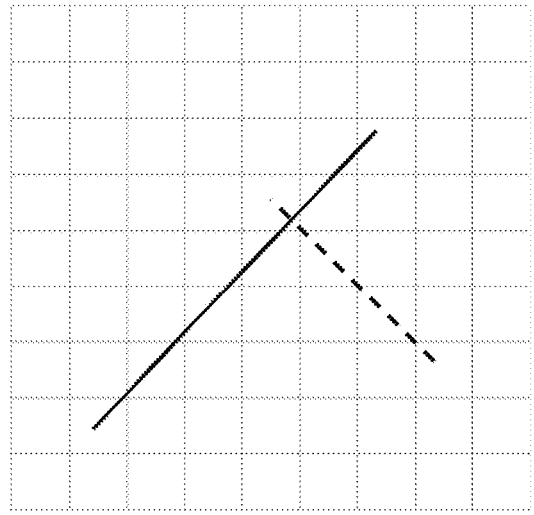
FIGS. 2-5 illustrate an example implementation of the method.
Figure 3:
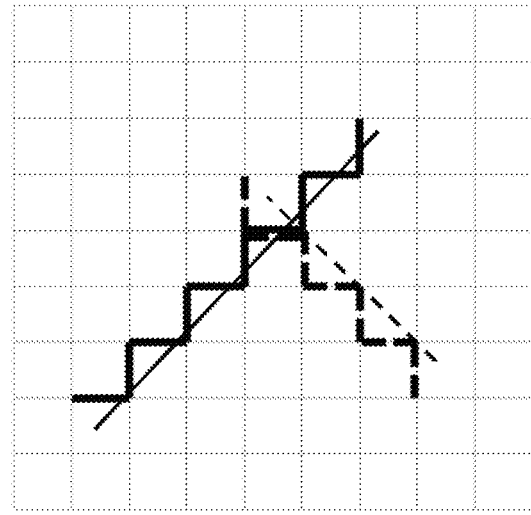
Figure 4:
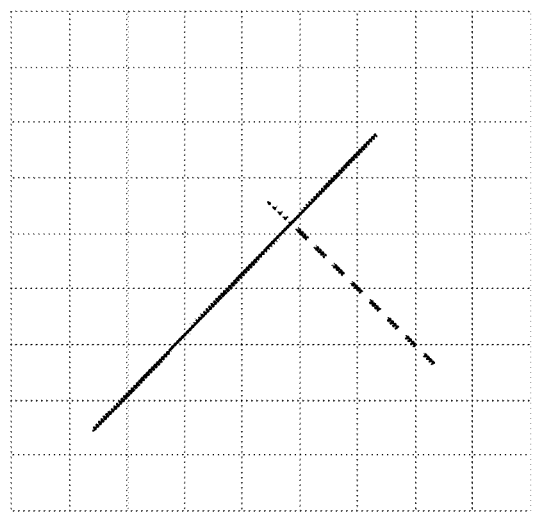
Figure 5:
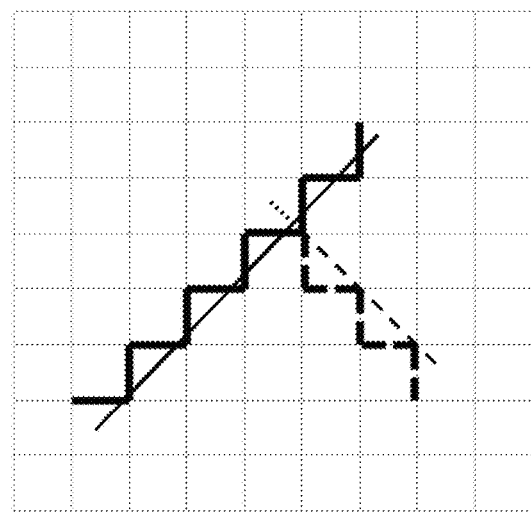

FIG. 2 shows two faults crossing without any hierarchy between them. FIG. 3 shows faults inserted in the mesh without taking hierarchy into account. FIG. 4 shows two faults crossing with a hierarchy between them (dashed branching on solid). FIG. 5 shows faults inserted in the mesh taking hierarchy into account. The result of FIG. 5 is more accurate than the result of FIG. 3, since cell pair interfaces are not used to represent the surface twice.

Such implementations of the method work quickly on structured or unstructured grids, and allow to implicitly integrate a structural model into an existing grid by respecting the contacts between geological surfaces and their hierarchy. This is done without any modification or deformation of the grid that could lead to loss of accuracy and loss of performance of the flow simulator.

Such implementations of the method allow to reproduce the (geometrically clean) contacts of the subsequent structural model in the connections between cells of the simulation grid. This avoids many artifacts when simulating complex systems (removing many "false" connections).

This is a useful quality control (QC) tool because it allows to check the cleanliness of the contacts and the conformity to the geological hierarchy directly in the simulation grid, which may be displayed.

In applications of the method, the designing of the geological simulation grid further comprises determining flow panels based on the determined pairs of cells. A flow panel is with respect to a structural model a maximal connected group of cells delimited by surfaces of the structural model. Flow panels allow performing black-oil tank simulations, which perform relatively fast. The accuracy of the method allows accuracy of such simulations.

Determining each respective flow panel may be performed via a neighborhood propagation from a starting cell. This allows a high computational efficiency. For example, the neighborhood propagation may comprise relative to a cell encountered when determining one respective flow panel:
  if the encountered cell is not present in (i.e. does not belong to) the set of all the pairs of cells determined as representing surfaces, adding all neighboring cells of the encountered cell to the respective flow panel, or
  if, on the contrary, the encountered cell is present in the determined pairs of cells, adding all neighboring cells of the encountered cell to the respective flow panel except neighboring cells which form a determined pair of cells with the encountered cell.

This leads to an accurate result. Integrated to the above implementations comprising steps a) to f), this example amounts to adding the following step:
  g) the flow panels are determined by a simple neighborhood propagation from the cells determined in the previous steps.

The neighborhood propagation may be as follows:
  i. We start from a cell.
  ii. If the cell is not present in the list of pairs found earlier, we add all the neighbors and continue the propagation.
  iii. If the cell is present in the list of pairs found earlier, we add all the neighbors except those that form a pair that is present in the list with the cell. The propagation continues.
  iv. When the propagation is no longer possible (cells from which it may be performed have been exhausted), a flow panel is created and another free cell of the grid is chosen to propagate the next flow panel.
  v. The propagation continues until the cells of the grid are exhausted.

Applications of the method allow to create flow panels that respect the connectivity and hierarchy of the subsequent structural model. The number of "flow panels" created is the minimum necessary, in contrast to some state-of-the-art methods that create a combinatorial number of flow panels including some that are "artificial".

In other applications of the method (combinable with the previous applications), the method may comprise designing at least another geological simulation grid (in examples, more than ten, fifty, or a hundred other geological simulation grids, the following steps pertaining to one other geological simulation grid being repeatable for each other geological simulation grid).

In other words, the method designs a first geological simulation grid based on a first subsequent structural model, and also (e.g. then) a second simulation grid based on a second subsequent structural model. The designing of the second geological simulation grid may comprise providing a geometrical grid (which may the same as the one already used for designing the first geological simulation grid), and providing another and different subsequent structural model (the second subsequent structural model) that represents geological surfaces of the geological environment (with again one or more geological surfaces each in contact with at least one other geological surface structural model). The determining of cell pairs may then be performed for this second subsequent structural model in the same manner as for the first subsequent structural model (e.g. in line with the example of FIG. 1, for example with the provided implementations thereof).

As the first subsequent structural model can differ from the optional initial structural model, the second subsequent structural model may differ from the first subsequent structural model. For example, at least one geological surface of the first subsequent structural model is not represented by the second subsequent structural model, and/or at least one geological surface of the second subsequent structural model is not represented by the first subsequent structural model. Additionally or alternatively, at least one geological surface represented by both the first and second subsequent structural model may be represented by different geometrical surfaces (in other words, they may be represented positioned differently in the structural models). Yet additionally or alternatively, the second structural model may differ from the first structural model in its contact and/or hierarchy information. For example, the second structural model may represent pairs of surfaces with a contact between them, and the same pair may be represented in the first structural model without the contact. Also, the first and second structural model may both represent a same pair of contacting surfaces with a same contact, but the two models may represent a different hierarchy.

In examples, throughout the different iterations of the method, the geometrical grid may stay the same (i.e. be unmodified). Again, computing a geometrical grid is time-consuming, and by avoiding changing the geometrical grid, these applications of the method allow saving time.

A new workflow may be provided in which the subsequent structural model is modified and the impact of the modification is reproduced in the simulation grid without modifying the geometrical grid. The second subsequent structural model may be obtained by modifying the first subsequent structural model (e.g. via user-interaction and/or based on geological information), for example by deleting a surface and/or adding a surface, by modifying positioning of a surface and/or geometry of a surface, and/or by modifying the hierarchy. This may be performed by a geologist making a hypothesis, and/or processing by trial and error. The method allows doing so in a simple way, and comparing results of running the method on the different subsequent structural models. The method may then retain one or more subsequent structural model, for example as the most likely ones.

In particular, the method may comprise performing a first hydrocarbon flow simulation based on the first geological simulation grid, and performing a second hydrocarbon flow simulation based on the second geological simulation grid. The method may further comprise comparing the hydrocarbon flow simulation and the other hydrocarbon flow simulation. The comparison can be immediate in case the flow simulations are finite volume simulations. The results can also be compared with real data, thereby allowing a geologist to retain the right structural model.

The method thus allows to introduce surface properties in the flow simulation and more precisely to the connections between cells. For example, transmissibility multipliers dependent on the rejection or shale gouge variable ratio on the subsequent structural model faults can be introduced through this method. This is extremely useful in the case of the evaluation of structural uncertainties, in which a very large number of structural models (with in principle different connections and hierarchies) are generated and used to simulate. With the proposed method, all these realizations can be simulated in the same simulation grid, even very simple, provided that it has a sufficient resolution.

Benefits may include:
The step of geometric QC of the mesh is no longer necessary for each run (which is greedy in computing time and human time), but can be done once and for all on the starting grid;
The calculation results of each run can be directly compared cell by cell, allowing a very fine and sharp analysis of the structural uncertainty;
The step of gridding (generating the grid) being very greedy in computing resources and human time, is avoided completely except for the first grid.
The quality of contacts and hierarchy is guaranteed by the proposed method once the subsequent structural model of each realization is clean.

Providing the geometrical grid may comprise providing a 3D volume and a resolution value, and gridding the 3D volume according to the resolution value. This allows control on the level of details represented by the geometrical grid. As mentioned above, the gridding may be performed based on an initial structural model, which may thus be represented in the 3D volume.

The resolution value may be computed based on the first and/or second subsequent structural model, for example to take into account the level of details and/or the amplitude (i.e. size) of the modifications intended for the two models.

An application of the method is the assessment of structural uncertainties, which impacts the evaluation of the "contingent resources" in the reservoir. In this evaluation, a large number of structural models are generated, each resulting in the generation of a structural grid. With the proposed method, each realization can be simulated in the same structural grid (with potentially a loss of precision depending on the resolution of the initial grid), with a great gain in computation time, human time and a very good correspondence between the calculation results of different realizations. This workflow allows to quickly obtain results (even if potentially approximated) on an evaluation of structural uncertainties while respecting for each realization the constraints of surface contact/connection and geological hierarchy. The ability of the method to generate the flow panels by respecting the subsequent structural model of each realization also allows to easily create "black-oil tank" simulations with software such as MBAL. This is extremely useful in an exploration context.

Operational projects often face the following problems: the transmissibilities of the faults are often calibrated in the reservoir simulations in order to reproduce the existing production data and predict the future behavior of the reservoir. However, many existing methods (fault blocks, fault keywords) are not suited to the stair-step representation of geological surfaces or are too complicated to use because of the combinatorial increase of the parameters to be adjusted. The method allows to take into account all the geological information contained in the subsequent structural model to ensure that the set of connections between cells influenced by the geological surfaces does not contain artifacts. The method also allows the creation of a minimal number of flow panels, which allows a simpler analysis of the results of the flow simulation. Finally, a study of structural uncertainty can be very expensive if each realization is simulated in its own grid, which multiplies the computing times, of human work (in particular the geometric QC of a large number of grids) and a difficult comparison between the calculation results of the different achievements. The proposed method avoids all this at the cost of a few approximations related to the resolution of the (only) grid used to simulate all achievements. This can be done as follows:

i. create a relatively thin grid that covers the volume of interest. The resolution must be sufficient to represent the subsequent structural model as well as the anticipated deformations;

ii. generate all the necessary structural model outputs;

iii. for each realization, use the proposed method to represent the realization of the subsequent structural model through properties on the connections of the grid;

iv. transfer transmissibilities and other properties to the simulation, for example using "flow panels" in the MBAL or ECLIPSE simulator or "connection sets" in the INTERSECT simulator.

This method can be used in several production projects that are in the phase of pure exploration and conceptualization (green fields) among others to carry out rapid simulations, rapid screening and first assessments of structural uncertainties. In general, the method allows to make the estimation of structural uncertainties much quicker and to quickly carry out "black oil tank" simulations as part of the exploration of the group.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

Figure 6:
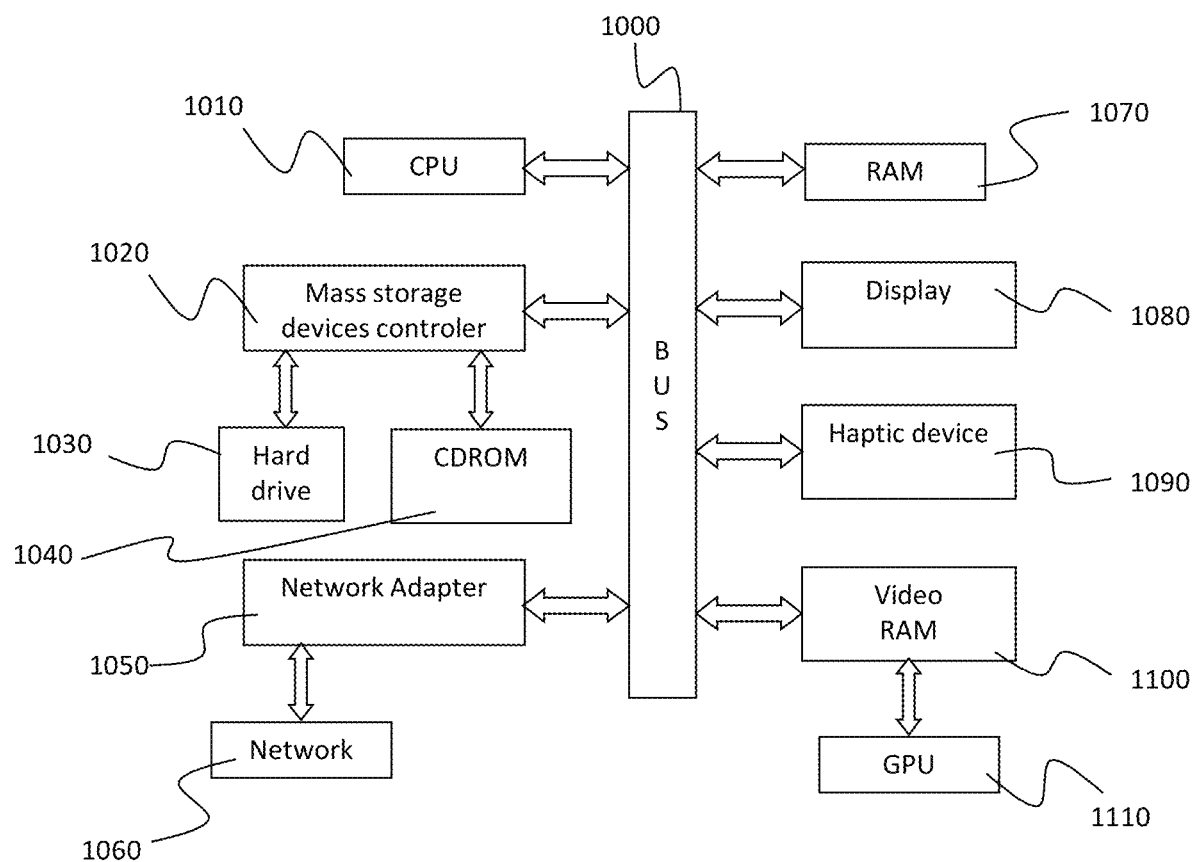
FIG. 6 shows an example of the system.

FIG. 6 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

One or more iterations of the method may be integrated in a hydrocarbon production process. The process may comprise performing one or more physical actions on the geological environment based on a result of the one or more iterations of the method. The one or more physical actions may comprise extracting hydrocarbon and/or injecting fluid in the subsoil to enhance extraction, fracking, performing (e.g. seismic) measurements, and/or drilling and/or operating one or more (e.g. production and/or injections) wells.

Notably, one or more (e.g. all) iterations may include each one or more hydrocarbon flow simulations. In such a case, the one or more physical actions may be based on one or more results of one or more such flow simulations. The process may for example comprise setting a value of one or more production parameters as a function of said one or more results, and then performing the one or more physical actions based on said one or more production parameter values, and at least eventually extracting hydrocarbon based on said one or more actions.

In examples, the one or more productions parameters may comprise a parameter consisting of well location information, a value of the parameter corresponding to information relative to location one or more production wells and/or one or more injections wells. In such a case, the extracting may comprise drilling new wells and/or operating already-drilled wells according to said well location information. Additionally or alternatively, the one or more productions parameters may comprise a parameter consisting of well operation information, a value of the parameter corresponding to information relative to operation of one or more production wells and/or one or more injections wells. In such a case, the extracting may comprise operating wells according to said well operation information.

In additional or alternative examples, the one or more production parameters may comprise a fracking location parameter, a fracking type parameter, a seismic measurement location parameter, and/or a seismic type parameter.

The invention claimed is:

1. A computer implemented method comprising:
    (i) a computer-implemented step of designing a geological simulation grid configured for hydrocarbon flow simulation in a geological environment, the designing of the geological simulation grid comprising:
    providing a geometrical grid having cells and representing the geological environment;
    providing a structural model that represents geological surfaces of the geological environment, the geological surfaces comprising one or more geological surfaces each in contact with at least one other geological surface; and determining, for each geological surface of the structural model, pairs of cells that represent the geological surface, the pairs of cells determined for at least one respective geological surface in contact with at least one respective other geological surface each including a first cell and a second cell located both on a same side of the at least one respective other geological surface;

wherein the determining comprises:

identifying a set of pairs of cells arranged along the at least one respective geological surface; and removing, from the set, each pair of cells including a first cell and second cell located on different sides of the at least one respective other geological surface;

wherein the designing of the geological simulation further comprises providing a hierarchy between the geological surfaces, and the removing comprises, for each identified pair of cells of the cell:

a loop iterated on each geological surface in contact with and higher in the hierarchy than the at least one respective geological surface, an iteration of the loop comprising for a given geological surface:

testing whether the identified pair of cells are located on different sides of the given geological surface; and:

if the test is positive, then eliminating the identified pair of cells and exiting the loop; alternatively if the test is negative, then continuing the loop;

ii. the computer-implemented step of performing one or more hydrocarbon flow simulations based on the geological simulation grid; and iii) based on the one or more hydrocarbon flow simulations, performing one or more physical actions of extracting hydrocarbons and/or injecting fluid in a subsoil to enhance hydrocarbon extraction, and/or operating one or more hydrocarbon production and/or injections wells.

2. The method of claim 1, wherein the designing of the geological simulation further comprises providing a hierarchy between the geological surfaces, the at least one respective other geological surface being higher in the hierarchy than the at least one respective geological surface.

3. The method of claim 2, wherein the at least one respective other geological surface comprises each geological surface in contact with and higher in the hierarchy than the at least one respective geological surface.

4. The method of claim 1, wherein the at least one respective geological surface comprises each geological surface of the structural model in contact with at least one other geological surface.

5. The method of claim 1, wherein the designing of the geological simulation grid further comprises assigning, to each respective pair of cells of each respective geological surface, a transmissibility value or multiplier depending on the respective geological surface.

6. The method of claim 1, wherein the designing of the geological simulation grid further comprises determining flow panels based on the determined pairs of cells.

7. The method of claim 6, wherein determining each respective flow panel is performed via a neighborhood propagation from a starting cell.

8. The method of claim 7, wherein the neighborhood propagation comprises relative to an encountered cell:

if the encountered cell is not present in the determined pairs of cells, adding all neighboring cells of the encountered cell to the respective flow panel, or if the encountered cell is present in the determined pairs of cells, adding all neighboring cells of the encountered cell to the respective flow panel except neighboring cells which form a determined pair of cells with the encountered cell.

9. The method of claim 1, wherein the method further comprises designing another geological simulation grid, the designing of the other geological simulation grid comprising:

providing the geometrical grid;

providing another structural model that represents geological surfaces of the geological environment, the geological surfaces comprising one or more geological surfaces each in contact with at least one other geological surface structural model; and performing the determining for each geological surface of the other structural model.

10. The method of claim 9, wherein the determining is performed for each geological surface of the other structural model without changing the geometrical grid.

11. The method of claim 9, wherein the method further comprises:

performing a hydrocarbon flow simulation based on the geological simulation grid; and performing another hydrocarbon flow simulation based on the other geological simulation grid.

12. The method of claim 11, wherein the method further comprises comparing the hydrocarbon flow simulation and the other hydrocarbon flow simulation.

13. The method of claim 9, wherein providing the other structural model comprises:

providing the structural model; and modifying the structural model.

14. The method of claim 9, wherein providing the geometrical grid comprises:

providing a 3D volume and a resolution value; and gridding the 3D volume according to the resolution value.

15. The method of claim 14, wherein the resolution value is computed based on the structural model and/or on the other structural model.

16. A non-transitory computer readable medium having recorded thereon a computer program comprising instructions for performing a method comprising:

designing a geological simulation grid configured for hydrocarbon flow simulation in a geological environment, the designing of the geological simulation grid comprising:

providing a geometrical grid having cells and representing the geological environment;

providing a structural model that represents geological surfaces of the geological environment, the geological surfaces comprising one or more geological surfaces each in contact with at least one other geological surface; and determining, for each geological surface of the structural model, pairs of cells that represent the geological surface, the pairs of cells determined for at least one respective geological surface in contact with at least one respective other geological surface each including a first cell and a second cell located both on a same side of the at least one respective other geological surface;

wherein the determining comprises:
    identifying a set of pairs of cells arranged along the at least one respective geological surface; and
    removing, from the set, each pair of cells including a first cell and second cell located on different sides of the at least one respective other geological surface;
    wherein the designing of the geological simulation further comprises providing a hierarchy between the geological surfaces, and the removing comprises, for each identified pair of cells of the cell:
    a loop iterated on each geological surface in contact with and higher in the hierarchy than the at least one respective geological surface, an iteration of the loop comprising for a given geological surface:
        testing whether the identified pair of cells are located on different sides of the given geological surface; and:
            if the test is positive, then eliminating the identified pair of cells and exiting the loop; alternatively
            if the test is negative, then continuing the loop;
(ii) a computer-implemented step of performing one or more hydrocarbon flow simulations based on the geological simulation grid; and
(iii) based on the one or more hydrocarbon flow simulations, performing one or more physical actions of extracting hydrocarbons and/or injecting fluid in a subsoil to enhance hydrocarbon extraction, and/or operating one or more hydrocarbon production and/or injections wells.

17. A system comprising a processor coupled to a memory, the memory having recorded thereon a computer program comprising instructions for performing a method comprising:
    designing a geological simulation grid configured for hydrocarbon flow simulation in a geological environment, the designing of the geological simulation grid comprising:
        providing a geometrical grid having cells and representing the geological environment;
        providing a structural model that represents geological surfaces of the geological environment, the geological surfaces comprising one or more geological surfaces each in contact with at least one other geological surface; and
    determining, for each geological surface of the structural model, pairs of cells that represent the geological surface, the pairs of cells determined for at least one respective geological surface in contact with at least one respective other geological surface each including a first cell and a second cell located both on a same side of the at least one respective other geological surface;
    wherein the determining comprises:
        identifying a set of pairs of cells arranged along the at least one respective geological surface; and
        removing, from the set, each pair of cells including a first cell and second cell located on different sides of the at least one respective other geological surface;
    wherein the designing of the geological simulation further comprises providing a hierarchy between the geological surfaces, and the removing comprises, for each identified pair of cells of the cell:
    a loop iterated on each geological surface in contact with and higher in the hierarchy than the at least one respective geological surface, an iteration of the loop comprising for a given geological surface:
        testing whether the identified pair of cells are located on different sides of the given geological surface; and:
            if the test is positive, then eliminating the identified pair of cells and exiting the loop; alternatively if the test is negative, then continuing the loop;
(ii) a computer-implemented step of performing one or more hydrocarbon flow simulations based on the geological simulation grid; and
(iii) based on the one or more hydrocarbon flow simulations, performing one or more physical actions of extracting hydrocarbons and/or injecting fluid in a subsoil to enhance hydrocarbon extraction, and/or operating one or more hydrocarbon production and/or injections wells.

* * * * *